(12) United States Patent
Krumpholz et al.

(10) Patent No.: US 9,739,821 B2
(45) Date of Patent: Aug. 22, 2017

(54) ARC DETECTION

(71) Applicant: DET International Holding Limited, George Town, Grand Cayman (KY)

(72) Inventors: Christian Krumpholz, Freiburg (DE); Zoran Radakovic, Novi Beograd (RS); Nikola Georgijevic, Simanovci (RS); Srdjan Srdic, Zemun Belgrade (RS)

(73) Assignee: DET INTERNATIONAL HOLDING LIMITED, George Town, Grand Cayman (KY)

( * ) Notice: Subject to any disclaimer, the term of this patent is extended or adjusted under 35 U.S.C. 154(b) by 4 days.

(21) Appl. No.: 14/285,903

(22) Filed: May 23, 2014

(65) Prior Publication Data

US 2014/0347069 A1    Nov. 27, 2014

(30) Foreign Application Priority Data

May 24, 2013  (EP) ..................................... 13405064

(51) Int. Cl.
*G01R 31/02* (2006.01)
*H02H 1/00* (2006.01)
*G01R 31/40* (2014.01)

(52) U.S. Cl.
CPC ......... *G01R 31/025* (2013.01); *H02H 1/0015* (2013.01); *G01R 31/40* (2013.01); *Y02E 10/56* (2013.01)

(58) Field of Classification Search
CPC .... G01R 31/025; G01R 31/02; G01R 31/021; G01R 31/023; G01R 1/07; G01R 15/16; G01R 31/024; G01R 31/1272; G01R 1/22; G01R 19/145; G01R 27/16; H02H 1/0015; H04B 3/46; G01V 15/00
USPC .................... 324/76.19–76.22, 539–544, 54; 361/1–14, 134, 135
See application file for complete search history.

(56) References Cited

U.S. PATENT DOCUMENTS

| | | | | |
|---|---|---|---|---|
| 4,466,071 A | * | 8/1984 | Russell, Jr. | H02H 1/0015 324/520 |
| 5,559,689 A | * | 9/1996 | Kirchberg | G01R 25/00 363/132 |
| 5,729,145 A | * | 3/1998 | Blades | G01R 31/1272 324/522 |
| 6,388,849 B1 | * | 5/2002 | Rae | B82Y 10/00 257/E43.004 |
| 6,751,528 B1 | * | 6/2004 | Dougherty | G01R 31/333 324/536 |

(Continued)

*Primary Examiner* — Patrick Assouad
*Assistant Examiner* — Demetrius Pretlow
(74) *Attorney, Agent, or Firm* — Birch, Stewart, Kolasch & Birch, LLP

(57) ABSTRACT

In a method for detection of an arc in a current path of a converter arrangement (2) for converting a DC input power to an output power, an arc is detected by sensing the current (4) in the current path by means of a current transformer (11), filtering the current signal (4') with an analog band pass filter (14), converting the analog filtered current signal (4") into a digital current signal (4'''), determining the harmonic content (19) of the digital current signal (4''') and then deciding whether an arc exists if the harmonic content (19) exceeds a threshold, where the threshold is determined at the beginning as a multiple of the average harmonic content during a certain period of time of the current signal.

23 Claims, 2 Drawing Sheets

(56) References Cited

U.S. PATENT DOCUMENTS

| | | | |
|---|---|---|---|
| 8,179,147 B2 | 5/2012 | Dargatz et al. | |
| 8,924,169 B1* | 12/2014 | Ledenev | G01R 31/1227 |
| | | | 361/93.2 |
| 2005/0057869 A1* | 3/2005 | Hale | H02H 5/10 |
| | | | 361/64 |
| 2005/0207083 A1 | 9/2005 | Rivers, Jr. et al. | |
| 2005/0286185 A1* | 12/2005 | Henson | H02H 1/0015 |
| | | | 361/42 |
| 2010/0097733 A1 | 4/2010 | E. | |
| 2011/0141644 A1* | 6/2011 | Hastings | H01L 31/02021 |
| | | | 361/93.2 |
| 2013/0038971 A1* | 2/2013 | Ward | H02H 1/0015 |
| | | | 361/86 |
| 2013/0094112 A1* | 4/2013 | Burghardt | H01L 31/02021 |
| | | | 361/42 |
| 2013/0170084 A1* | 7/2013 | Strobl | H02H 1/0015 |
| | | | 361/79 |
| 2014/0063662 A1* | 3/2014 | Scott | G08B 13/22 |
| | | | 361/42 |
| 2014/0067291 A1* | 3/2014 | Balog | H02S 50/10 |
| | | | 702/58 |

* cited by examiner

ARC DETECTION

TECHNICAL FIELD

The invention relates to a method for detection of an arc in a current path of a converter arrangement for converting a DC input power to an output power, including the steps of producing a current signal by sensing a current in the current path. The invention further relates to a device for detection of an arc in a current path of an arrangement for converting DC input power to an output power, including a current sensing device adapted to produce a current signal by sensing a current in the current path.

BACKGROUND ART

The importance of alternative energy sources has increased over the last decades. One of these alternatives is solar energy and accordingly, the number of installations of PV (photo voltaic) systems has grown immensely.

PV systems (also: PV arrangements or PV assemblies) have been further developed in recent years to increase reliability and safety. Great efforts have for example been undertaken in order to avoid arcs in PV systems. However, how to deal with an arc once an arc occurs is a problem that still has not been solved satisfyingly.

Arcs may occur when a sufficiently high voltage is generated between two electrodes. The voltage may cause ionization of the gas (generally air) between the electrodes, such that a plasma may evolve and a current may flow between the electrodes. Such a plasma may heat up to several 1000° C. thereby causing the characteristically bright arc to appear. Such temperatures can cause damage to the system and in some cases even fire of the system or nearby installations.

There exist two different types of arcs in PV systems: parallel and serial arcs. Parallel arcs occur either between the positive and negative pole of the PV system or between one of the poles and ground. Serial arcs in contrast do not occur between two different lines but within one of the current conducting lines, i.e. between two parts of the same line. Serial arcs typically occur when a current in a line is disrupted, for example by opening a contact switch or in case of breaking plugs/cables or the like.

In order to reduce the impact of arcs countermeasures to break an arc have to be initiated as soon as possible. It is therefore of high importance that the presence of an arc is determined as fast and as reliable as possible.

U.S. Pat. No. 8,179,147 B2 discloses a method and apparatus for managing series and parallel DC arc faults in a DC circuit of PV systems. Such a PV system comprises a power stage with several branches connected in parallel where each branch includes a PV module (104) connected to a power converter (102). The power stage is connected to a load center (108) which is connected to an AC power grid.

Detection of an arc fault is done by analyzing a signature of a current signal and analyzing a signature of a voltage signal of the power converter and determining based on this analysis, whether an arc fault exists and what type of arc fault is present. In particular, an arc is determined by analyzing the current signal for a change in polarity or a rapid change in slope of the signal. If a potential arc fault is identified, the voltage signal is analyzed as well and then compared to the current signal analysis. If an arc fault match exists, the DC current polarity is utilized to differentiate whether a series or a parallel arc has occurred. Based on the determination of the presence and the type of the arc, further measures are initiated.

The known method and apparatus for detection of an arc is very complicated. Accordingly, it takes a lot of effort, different elements and time to analyze the different signals, to compare the results of the analysis and to determine the presence and the type of an arc.

SUMMARY OF THE INVENTION

It is the object of the invention to provide a method for detection of an arc in a current path of a converter arrangement for converting a DC input power to an output power pertaining to the technical field initially mentioned, that allows for a simpler and faster detection of the arc. It is a further object of the invention to provide a corresponding device.

The solution of the invention is specified by the features of claim 1. The method for detection of an arc in a current path of a converter arrangement for converting a DC input power to an output power includes the step of producing a current signal by sensing a current in the current path. According to the invention a harmonic content of the current signal is determined and it is decided that an arc exists if the harmonic content exceeds a threshold.

To be precise the invention deals with electric arcs only but not with arcs of other kinds that do also exist. Accordingly, the term arc as used throughout the description does denote an electric arc and not any other kind of arc.

Accordingly, only one of the converter signals—the current signal—has to be analyzed in order to determine whether an arc is present or not. The method is therefore simpler to implement, it does require less elements (it does for example not require a voltage measurement device) and since it does not require the successive analysis of different signals it is also faster.

The term converter arrangement shall in connection with this description include every arrangement such as a current/voltage converter as well as a current/voltage inverter or combinations thereof for converting a DC input power to an output power, either AC or DC.

The decision whether an arc fault exists could be based on the determination of the harmonic content of a single time segment of the current signal which could either be a short segment (in the range of milliseconds), a long segment (in the range of seconds, minutes, hours or even days) or a time segment having a length somewhere in between.

In a preferred embodiment of the invention, the harmonic content of the current signal is determined for at least two time segments of the current signal. If the harmonic content during one or more of these time segments exceeds the threshold, it is decided that an arc exists. These time segments do not have to have the same length.

In a further preferred embodiment of the invention, the harmonic content is periodically determined for a plurality of time segments of the current signal, where each time segment has the same length. The length of these time segments is between 1 millisecond and 1000 milliseconds, more preferably between 20 milliseconds and 200 milliseconds and even more preferably between 80 milliseconds and 120 milliseconds. While the time segments to be analyzed periodically preferably overlap for a fraction of their length (for example between 10% and 70% of their length), these time segments could also be chosen such that one is directly following the other or even such that there remains a gap of unused signal between two successive time segments. However, the overlapping of the time segments improves the accuracy of the harmonic content determination by mitigating the "losses" at the edge of each time segment.

Depending on the number of time segments wherein the harmonic content of the current signal exceeds the threshold, different kinds, categories or levels of arcs may be distinguished. If the harmonic content of the current signal for example exceeds the threshold just for some time segments such as for example more than 5 or 10 but less than 20, 25 or 30 consecutive and overlapping time segments, the method can decide that a short arc is present which could for example be named "bad contact". But if the harmonic content of the current signal for example exceeds the threshold for more than 20, 25 or 30 consecutive and overlapping time segments the method can decide that a long arc is present.

The measures that are taken once an arc is detected may therefore also depend on the kind of arc that is detected. If for example a short arc is detected it is possible to just inform the person in charge such as the operator of the arrangement or the supervisor of the PV site that such a short arc or bad contact has occurred. The person in charge then may check the installation to identify and eliminate the reason for the bad contact. If however, a long arc is detected the converter may for example be switched off immediately, for example by generating a corresponding signal that is sent to the control which in response switches off the converter.

By defining two thresholds it is possible to distinguish three categories of arcs, namely no arc, short arc and long arc. By defining and checking three or more thresholds it is however also possible to distinguish four or more categories of arcs. It is of course also possible to define just one threshold in order to decide whether an arc is present or no arc is present. The exact value/s of the threshold/s has/have to be set based on the particular implementation.

With the method according to the invention it is in general possible to detect serial and parallel arcs. In a preferred embodiment of the invention it is however preferred to detect serial arcs in a DC current path of the converter arrangement. Such a DC current path that can be used for detecting a serial arc is present in each converter arrangement anyway. So the current flowing in such a DC current path can be sensed and analyzed for detecting a serial arc. For detecting parallel arcs there usually does not exist a dedicated current path for sensing the current to be analyzed. Therefore, first a suitable current path for sensing the current has to be identified or such a current path even has to be provided by further measures.

The method according to the invention may be deployed for detection of a serial arc in different energy conversion systems that include a power converter for converting a DC input power to a DC or AC output power. Such systems not only include arrangements that obtain their input from an energy distribution network or an energy storage device such as a battery or the like, but also include systems that produce electrical energy by converting other types of energy to electrical energy. Such systems for example include hydroelectric power or wind power systems.

In a preferred embodiment of the invention, the method is employed in systems for converting solar energy to electrical energy, i.e. in an arrangement that includes at least one PV panel producing a DC power and a power converter for converting the DC power of the PV panel into a DC or AC output power. In such an arrangement a serial arc is detected in the DC current path of the PV panel. An application in PV systems is particularly advantageous because the risk that arcs could occur is higher than in other converter arrangements.

It is within the meaning of the invention that the harmonic content of the current signal, i.e. the whole spectral range of the current signal is determined. In order to reduce time and effort to determine the harmonic content of the current signal, it is however preferred that those harmonic components of the current signal that are not caused by a serial arc are at least partially removed before the determination of the harmonic content of the current signal.

There may also exist harmonic components of the current signal that are not directly caused but just affected by an arc. Such harmonic components are also present in the signal during normal operation of the converter, but are affected (for example damped, amplified or even shifted) when an arc occurs. Accordingly, the term "caused by a serial arc" may also be understood within the context of the current description to be read as "caused and/or affected by a serial arc".

Removing at least partially those harmonic components of the current signal that are not caused by a serial arc in particular means removing at least partially those spectral ranges of the current signal that are not caused by a serial arc. It is possible that during this operation some spectral ranges of the current signal that are actually caused by an arc are removed at least partially from the current signal as well.

Removing at least partially certain harmonic components of the current signal is generally done by filtering the signal with an appropriate filter. Such a filter may for example be a low pass filter. But since most of the energy in the current signal is present in the DC component and the lower spectral range of the current signal and since those harmonic components of the current signal which are caused by a serial arc are present in the higher spectral range, it is preferred to remove at least partially the harmonic components whose frequencies are lower than a certain frequency, denoted later on as the first frequency. Such filtering is generally called high pass filtering of a signal.

Filtering in general and therewith also high pass filtering of a signal can for example be done with a digital filter. However, in the present case, an analog filtering of the current signal—for example with an analog high pass filter—is preferred, since digital signal processing effort and therewith the complexity of a corresponding processing unit as used in further steps of the invention (as described below) can be reduced.

Instead of determining the harmonic content of the whole spectral range of the current signal, which is generally possible, the method according to the invention further preferably includes the step of removing at least partially the harmonic content of the current signal above a second frequency, where the second frequency is higher than the above mentioned first frequency. Together with the removal of the spectral parts below the first frequency, this results in a band pass filtering of the current signal with appropriate first and second frequencies such that those spectral parts of the current signal that are caused by an arc are still present in the band pass filtered current signal.

This at least partial removal of the signal frequencies above the second frequency has the advantage that the current signal is adapted for further processing, for example for an analog-to-digital conversion of the signal that can be done more accurate if the spectral range of the input signal is limited. Additionally, time and effort to determine the harmonic content can be further reduced if the signal spectrum is limited.

The band pass filter has for example a centre frequency between 1 kHz and 4 kHz and a 3 db bandwidth between 1 kHz and 10 kHz, more preferred is centre frequency ($f_c$) between 2 kHz and 3 kHz and a 3 db bandwidth between 4 kHz and 7 kHz.

Determination of the harmonic content of the current signal is generally also possible by processing the analog current signal with an appropriate analog electric circuit. However, it is preferred to determine the harmonic content of the current signal by digitally processing it, because it is very easy, compared to analog circuits, to implement such methods by means of a digital processing unit such as a digital signal processor. Accordingly, it is preferred to perform an analog-to-digital conversion of the current signal before its harmonic content is determined.

In case the current signal is high- or band pass filtered with an analog filter, the analog-to-digital conversion of the current signal is performed after the filtering of the current signal. If the filtering is done digitally, the analog-to-digital conversion is performed before.

Generally, the harmonic content of the current signal may be determined by processing the signal with analog processing means. It is however again preferred to determine the harmonic content by digitally processing the current signal. In a preferred embodiment of the invention, the method therefore includes the step of transforming the current signal from a time domain to a frequency domain. In the frequency domain, the harmonic content can be easily determined.

The transformation to the frequency domain is for example done by performing a discrete Fourier transform of the current signal. In order to reduce the effort of the calculations and to speed them up, it is preferred to perform a fast Fourier transform. Digital processing units like digital signal processors can be specifically designed to perform this task as fast and as accurate as required by a specific application.

There are different ways to define the threshold that is used to decide whether an arc is present or not. It is for example possible to determine the threshold previously to the execution of the method according to the invention, such that a fixed or constant value is used as the threshold each time the method is executed. Such a threshold could for example be determined empirically by performing a number of measurements with different thresholds and then choosing the value that best suits the requirements. Such a threshold could even be estimated or determined theoretically under consideration of the known or expected system configuration and circumstances.

However, in a preferred embodiment method according to the invention includes the step of determining the threshold.

The threshold can for example be determined repeatedly, at variable or constant intervals. This would have the advantage that the threshold reflects the current conditions such that the threshold may also change due to changing conditions, which would enhance the chances to detect an arc when one is present and not to decide that an arc exists when none is present. It has however to be ensured that no arc is present when the threshold is determined.

Instead of repeatedly determining the threshold, the threshold is preferably determined once at the beginning of the method, i.e. during a startup phase of the method. The method for example is started up each time when the converter arrangement is started up. As long as the converter arrangement is in operation, the method then will use the once determined threshold until the converter is shut down. This would reduce the overall calculation effort, particularly during operation of the converter when the computing capacity is used to determine whether an arc is present or not. It is however also possible that the threshold can be determined again at any time later during operation of the converter, either initiated manually or automatically for example in response to certain conditions. It is further possible that the threshold is determined only once when the inverter is assembled, for example during installation of the PV system. Also, threshold determining can be done at the factory for example at factory test and the threshold can be determined based on the results of the factory test (FAT), for example based on the known/measured behaviour at the FAT.

Before threshold determination, the algorithm may also include an initializing phase during which the algorithm reaches its steady state and all buffers are filled.

The threshold is preferably determined by determining the harmonic content of at least one portion of the current signal and multiplying this harmonic content by a factor n, where n is a number greater than 2. It has been found that good detection results can be achieved when n is a number between 2 and 50, preferably between 5 and 20 and more preferably between 8 and 13. The at least one portion of the current signal thereby includes for example one or more time segments as explained previously. It may further be restricted to a specified frequency band. This frequency band preferably corresponds to the 3 dB bandwidth of the above mentioned band pass filter, but may also differ from this filter bandwidth. The specified frequency band may for example start at the lower cutoff frequency of the band pass filter and end at the upper cutoff frequency of the filter. It may however start below or above the lower cutoff frequency and also end below or above the upper cutoff frequency.

In case the threshold is determined based on two or more time segments, the harmonic content is determined as the average of the harmonic contents of each of these segments and then this average harmonic content is multiplied by the factor n.

Instead of determining the threshold by multiplying the harmonic content of the at least one portion of the current signal with the factor n, it could also be determined by any user-defined function of the harmonic content of the at least one portion of the current signal. It is for example possible to just add a constant value or to add a value and then multiply the sum by some factor. In order to achieve reasonable detection results, the resulting threshold should be greater than the harmonic content of the at least one portion of the current signal.

In order to determine a suitable threshold, it should be ensured that the determination of the threshold takes place during a period of time where no arc is present.

The method may be applied in converter arrangements for converting the DC input power to a DC output power such as for example in PV systems used for feeding the solar energy into power storage devices like batteries or the like or directly to power consuming devices having a DC power input.

PV systems are however often used to supply power to AC power supply networks or directly to power consuming devices having AC power inputs. Accordingly, in a preferred embodiment of the invention, the DC input power is converted by the converter arrangement to an AC output power.

The AC output power is then preferably fed to a power consuming device or a power supply network. It would however also be possible to convert the AC output power back to DC and then feed it to a battery or the like or to a DC input power consuming device.

In case of a failure of the analog circuit the spectrum of the current signal at the output of the analog circuit may substantially differ from the real circumstances. The voltage signal at the output of the current sensing device can for example become high due to short (in time) but high (in amplitude) current changes at the primary circuit. These current changes can be, for example, inrush currents of the capacitors. The PV source usually will limit such currents but under certain conditions, such as for example laboratory conditions or at FAT the PV inverter can be supplied from DC or other high capacitive sources where such high voltages may occur. These high voltages can damage some elements of the analog circuit and result in unreliable current measurements which means that an arc may not be reliably detected.

In another preferred embodiment of the invention, the method therefore further includes the step of conducting a self test. Such a self test is particularly useful in order to prevent malfunction or false triggering of the arc detection. The self test may be performed at any time during operation of the arrangement or during a pause of operation. But preferably, such a self test is conducted during or before the start up of the converter or the PV system.

The self test preferably includes the following steps: First a test signal is generated and fed to the current sensing device via a low pass filter. This is for example done by feeding the test signal to a tertiary winding of the current sensing device. The test signal is coupled to the secondary winding of the current sensing device and is then sensed by the arc detection device in order to determine its amplitude and/or phase. Then the amplitude and/or phase of the test signal is compared with predefined values for the amplitude and/or phase of the test signal in an operational state of the arc detection device. If the analog circuit is damaged or the arc detection device does not operate correctly for other reasons, the amplitude and/or the phase of the test signal will differ from the amplitude and the phase of the test signal in its operational state. In this way it is possible to test the analog circuit thereby increasing the reliability of the arc detection device.

The solution of the invention regarding the device is specified by the features of claim 14. The device for detection of an arc in a current path of a converter arrangement for converting DC input power to an output power includes a current sensing device adapted to produce a current signal by sensing a current in the current path. According to the invention, the device further includes a processing unit adapted to determine a harmonic content of the current signal and a processing unit adapted to decide that an arc is present if the harmonic content exceeds a threshold.

By using dedicated and specifically designed hardware to realise the processing units for performing the determination of the harmonic content of the current signal and for deciding whether an arc is present or not, the method can be executed with the required accuracy and speed. Further, the number of elements used to implement the arc detection device can be relatively low.

In a preferred embodiment of the invention, the device includes a control unit comprising the processing unit for determining the harmonic content of the current signal as well as the processing unit for deciding whether an arc is present or not.

As explained before, all or part of the elements of the hardware can be realised for example by analog means such as analog filters, multipliers, amplifiers, comparators and the like. But some or (almost) all of the device's elements may also be implemented by digital means. The control unit is preferably implemented by digital means. More precisely the controller includes one or more digital signal processors (DSPs) for carrying out the required operations, for example a first DSP for determining the harmonic content of the current signal and a second DSP for deciding if the harmonic content exceeds the threshold. But the controller preferably includes one single DSP that is used for determining the harmonic content of the current signal and for deciding if the harmonic content exceeds the threshold. In this way, the device may be implemented with small space and energy consumption.

In a preferred embodiment of the invention, the device is adapted for detection of a serial arc in a DC current path of the converter arrangement.

In a preferred embodiment of the invention, the current sensing device includes a current sensor for sensing the DC PV panel current.

The current sensor may be of any suitable type, for example of the direct measuring type where a resistance is inserted into the current path and the voltage across the resistance is measured. This would however require an intervention into the system, because an additional element (the resistance) had to be inserted into the current path and would thereby change the whole system and its behaviour.

In another and preferred type of current sensor, the current is measured indirectly, for example by means of a current transformer. The current path to be measured is fed through the core of such a current transformer and therefore forms the primary winding of the current transformer. The secondary winding is formed by a sensing coil.

The current transformer used in connection with the invention described herein preferably includes a toroidal core that is made of iron powder and where the primary winding is formed by the DC current path of the PV panel and includes preferably one turn, but may also include two or even more turns. The secondary winding is formed by the sensing coil and preferably includes a plurality of turns.

In a further preferred embodiment of the invention, the arc detection device includes a band pass filter for band pass filtering the current signal. The band pass filter is in particular an analog band pass filter. But generally a digital band pass filter would do as well.

In a further preferred embodiment, the arc detection device is adapted to conduct a self test. In particular, the device:

includes a test signal generator adapted to generate a test signal, includes a low pass filter for low pass filtering the test signal and feeding it to the current sensing device, for example via a tertiary winding of the current sensing device, and adapted to determine an amplitude and/or a phase of the test signal and to compare the amplitude and/or the phase of the test signal with predefined values.

The self test, as described above, is then performed by generating the test signal with the test signal generator, which preferably is a part of the arc detection device, filtering the test signal with the low pass filter, feeding it to the current sensing device via a tertiary winding and determining the amplitude and/or the phase of the test signal in order to compare them with predefined values representing the amplitude and/or the phase of the test signal in a working condition of the arc detection device. However, another DSP, another processing unit or any other suitable means may be used to generate the test signal and to determine the amplitude and/or phase of it. In this way the values for the amplitude and/or the phase of the test signal are determined and may be compared to the amplitude and/or the phase of the test signal as determined at a later stage. A difference in one or both of these later determined values and the initially determined values may be a sign of a failure of the analog circuit.

The arc detector device according to the invention is preferably implemented as a part of the converter arrangement. It can however also be implemented as a part of the PV arrangement itself or it can even be implemented as a separate device such that existing PV installations can easily be refitted with such an arc detection device.

Other advantageous embodiments and combinations of features result from the detailed description below and the entirety of the claims.

BRIEF DESCRIPTION OF THE DRAWINGS

The drawings used to explain the embodiments show.

In the figures, the same components are given the same reference symbols.

PREFERRED EMBODIMENTS

Figure 1:
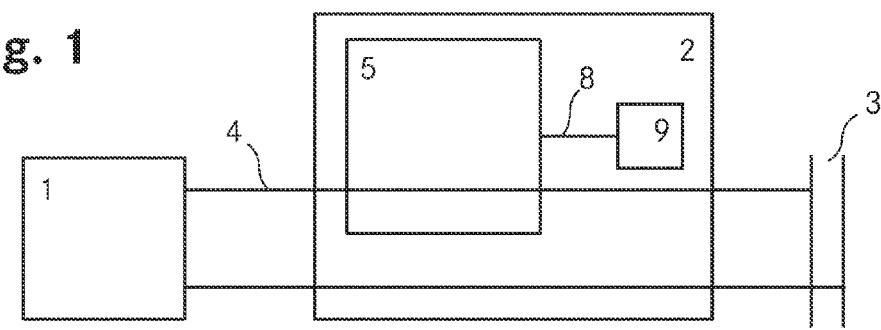
FIG. 1 a schematic diagram of the invention embedded in a converter for converting the output of a PV system for feeding it to a power supply network.

FIG. 1 shows a schematic diagram of a PV system 1, followed by a converter arrangement 2 for converting the output of the PV system 1 for feeding its power to a power supply network 3 such as an internal power supply network of a building or a public power supply net, where the converter arrangement 2 includes an arc detection device ADD 5 according to the invention.

The DC output current 4 of the PV system 1 is fed to the converter arrangement 2 wherein the ADD 5 measures the current 4, determines the harmonic content of the current 4 and decides whether an arc is present in the system or not. The ADD 5 is shown in more detail in FIG. 2. If the ADD 5 decides that a bad contact is present, it produces a "bad contact" signal 6 which is transmitted to a logic unit 7 for deciding whether a permanent arc is present. The output of the logic unit 7 is a "long arc present" signal 8, which is transferred to a control unit 9 of the converter arrangement 2. The control unit 9 then initiates the required countermeasures to end the arc as fast as possible.

Figure 2:
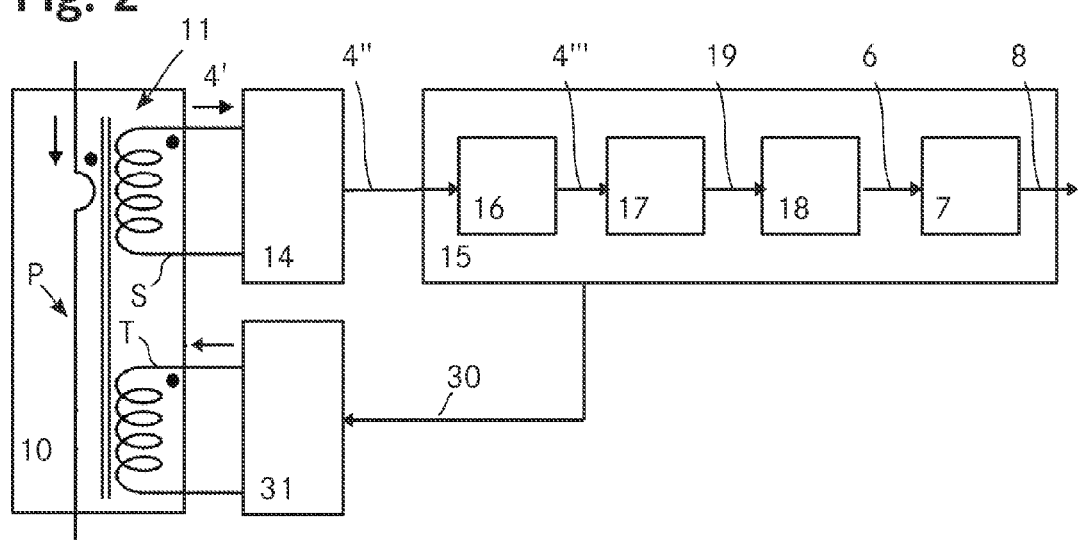
FIG. 2 an arc detector according to the invention.

FIG. 2 shows the ADD 5 in more detail. The ADD 5 includes a current sensor 10, an analog band pass filter 14 and a DSP 15.

The current sensor 10 is implemented in this example as a current transformer 11. The current transformer 11 includes a toroidal core that is made of iron powder and has an inductance factor $A_1$ of about 95 nH/N² (where N is the number of turns on the core) and a reference permeability $\mu_0$ of about 75.

The primary winding P of the current transformer 11 is formed by the DC output current path of the PV system 1 carrying the DC output current 4. The DC output current path of the PV system 1 is just fed through the transformer core so that the primary winding P includes just one turn. The secondary winding S includes 130 turns of a 0.5 mm magnet wire. In the secondary winding S therefore flows the analog secondary current signal 4', which is fed to the band pass filter 14. The band pass filter 14 is shown in more detail in FIG. 3. The output of the band pass filter 14 is the filtered current signal 4", which is still an analog signal that is used as the input of the DSP 15. The DSP 15 includes an A/D converter 16 for converting the analog filtered current signal 4" into a digital current signal 4''', an FFT unit 17 for determination of the harmonic content 19 of the digital current signal 4''', a detection unit 18 for deciding whether a bad contact exists and—if so—for producing the "bad contact" signal 6, and finally a logic unit 7 for deciding whether a permanent arc exists and—if so—for producing the "long arc present" signal 8.

For performing a self test, the ADD 5 further includes a test winding T, implemented as a tertiary winding of the current transformer 11. A test signal 30 is generated by the DSP 15, fed to the current sensor 10 over low pass filter 31 and coupled to the secondary winding S. At the same time the test signal is transferred to the DSP 15 over the analog band pass filter 14 and sensed by the DSP 15. If the sensed test signal 30 is in a predefined range regarding amplitude and/or phase, the analog circuit is considered to be in a functional state. The initial values for the amplitude and/or phase of the test signal 30 may for example be determined during the manufacturing of the converter arrangement or during installation of the PV system and stored within the converter arrangement. When performing the self test at a later stage, the values for the amplitude and/or phase of the test signal 30 are determined again and compared to the stored initial values. If one or both of these values differs it is decided that the ADD 5 may be defective for example that the analog circuit is not operating correctly and corresponding countermeasures may be initiated.

Figure 3:
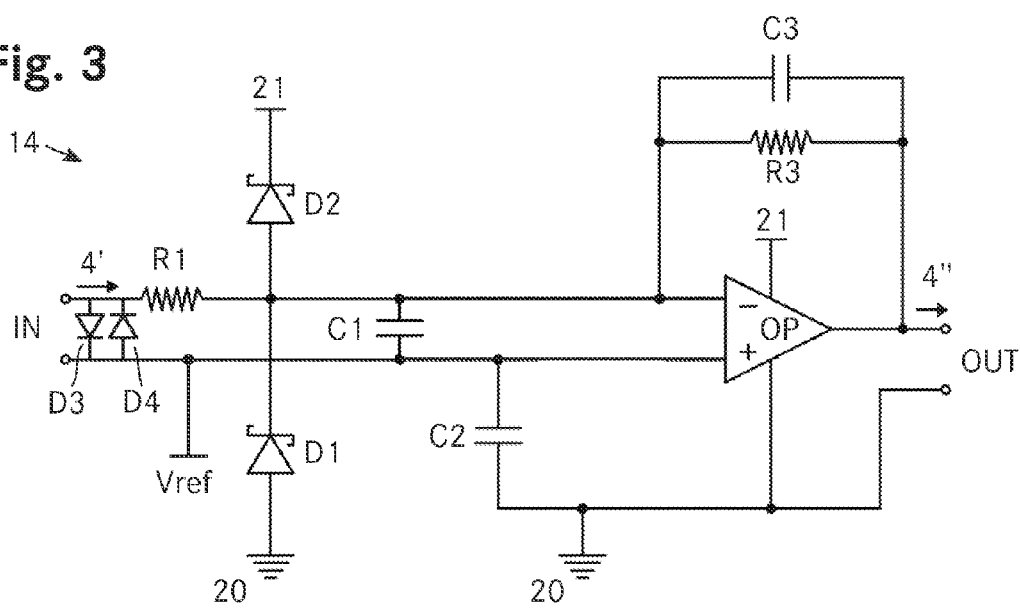
FIG. 3 an analog band pass filter as used in the arc detector as shown in FIG. 2.

FIG. 3 shows the analog band pass filter 14 in more detail. At the positive branch of the input IN of the band pass filter 14, the analog secondary current signal 4' is fed via a resistor R1 to the inverting input of an operational amplifier OP and the negative branch of the input IN is fed to the non-inverting input of the operational amplifier OP. The negative branch of the input IN is further connected to an external DC offset voltage which may also be called a reference voltage Vref. The operational amplifier OP is supplied with energy through connections to ground 20 and the supply voltage 21. The output OUT of the operational amplifier OP forms the analog filtered current signal 4". The second electrode of the output OUT is formed by ground 20.

A capacitor C1 is connected across the inputs of the operational amplifier OP. A first barrier diode D1 is connected in conduction direction from ground 20 to the inverting input of the operational amplifier OP and a second barrier diode D2 is connected in conduction direction from the inverting input of the operational amplifier OP to the supply voltage 21. A DC offset, denoted as reference voltage Vref of 1.5 Volts is connected to the non-inverting input of the operational amplifier OP. A capacitor C2 is connected between ground 20 and the non-inverting input of the operational amplifier OP.

Further, a parallel connection of a third resistor R3 and a third capacitor C3 is connected between the output OUT of the operational amplifier OP and its inverting input. Also, protection diodes D3 and D4 having opposing conduction directions are connected across the input IN.

Figure 4:
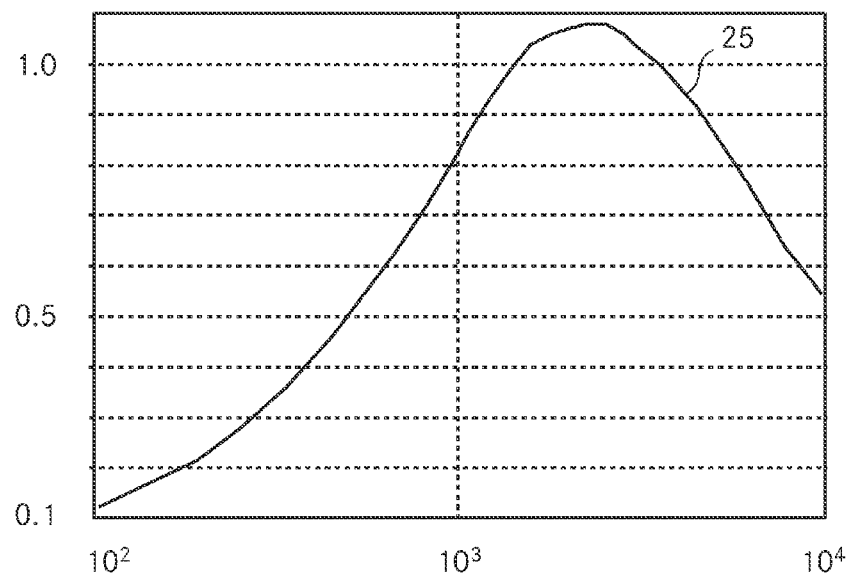
FIG. 4 the filter response of the filter as shown in FIG. 3.

The types and values of the components are chosen for example as follows:

supply voltage: 3.3 Volts
operational amplifier: OPA376
D1, D2: 1PS76SB21 Schottky Diode
D3, D4: BAS316
external DC offset: 1.5 Volts DC
C1: 1 nanoFarad
C2: 10 microFarad
C3: 22 nanoFarad
R1: 33 Ohm R3: 4.7 kiloOhm FIG. 4 shows the filter response 25 of the band pass filter 14. In the diagram shown in FIG. 4 the x-axis denotes the frequency in Hz and the y-axis denotes the output voltage magnitude in Volts. The input current is the variable frequency secondary current signal 4' from the current transformer 11 and is constant in amplitude (about 1.5 mA, p-p).

The band pass filter 14 is implemented as a low-Q band pass filter. The band pass filter 14 has a centre frequency of about 2.3 kHz and a 3 dB bandwidth of 1.8 kHz.

The band pass filter 14 eliminates the harmonic components in the secondary current signal 4' which exist due to other reasons, i.e. which are not caused by an existing DC arc in the PV system. Further, the filter 14 adjusts the secondary current signal 4' so that the A/D converter 16 of the DSP 15 can be optimally used.

The output of the A/D converter 16, the digital current signal 4'', is then processed by the FFT unit 17 in order to determine the harmonic content 19 of the digital current signal 4''.

The implemented FFT algorithm is a 1024-point split-radix FFT and is modified for a fixed point number representation. A sampling frequency of 10 kHz results in a window length of around 0.1 seconds. In order to reduce the spectral leakage caused by the discontinuities at the beginning and the end of each time segment, the appropriate window function (such as Hamming, Hann, Blackman or Bartlet function) may be applied to the samples. In a preferred embodiment of the invention, a Hamming window function is applied. Spectrum monitoring of the digital current signal 4''' is continuous and the time segment windows are chosen to overlap by 50%.

During the required butterfly computations of the FFT, overflows may occur if the larger number of samples is taken. In order to prevent such overflows, a division by two is performed. However, if such a division by two is performed after each stage during the butterfly computations, the noise-to-signal ratio would be increased by a half bit per stage, i.e. $0.5*\log_2(N)$ bits in total (N=number of stages). This means that a small input signal could be smaller than the division noise. In order to avoid an overflow during the butterfly computations and to have an acceptable noise-to-signal ratio, a dynamic prediction of the overflow is implemented. Accordingly, a division by two is not performed after each stage but only when needed. In this way, the rounding error can be minimized and a better precision can be achieved.

A further way of speeding up the FFT calculations is the acceleration of the computation of the magnitudes of complex numbers V that is also required for spectrum analysis. For a complex number such as for example a vector V with a real part I (in-phase part) and a imaginary part Q (quadrature part), the magnitude is computed as $$|V|=\sqrt{I^2+Q^2}.$$

which requires square root operations.

A known technique to determine the square root of such a vector V is the so-called αMax+βMin algorithm which is a linear approximate approach for determining the absolute value of a vector. This algorithm first requires the determination which of the real or imaginary part of the vector V has the greater absolute value. The greater absolute value of I or Q is then denoted Max and the other is denoted as Min, then the absolute value of the vector V can approximately determined as $$|V|\approx\alpha Max+\beta Min$$

where suitable values for α and β have to be determined. An ideal estimation curve for a unity magnitude vector would have a value of one. Several values for α and β have been tested. The following table shows some of the tested values for α and β as well as the errors involved compared to the ideal estimation curve of a value of 1 for the angle range from 0 degrees to 90 degrees.

| \|V\| ≈ | largest error | average error |
| --- | --- | --- |
| (Max + ½ Min) | 11.8% | 8.6% |
| (Max + ¼ Min) | −11.6% | −0.64% |
| (1Max + ⅜ Min) | 6.8% | 3.97% |
| (1Max + ⅜ Min) + (1Max + ¼ Min) | 3.4% | 1.21% |

Figure 5:
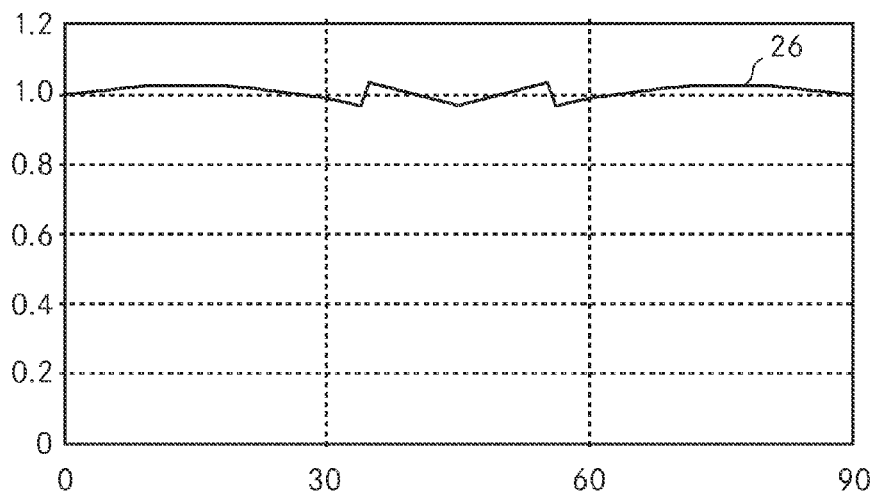
FIG. 5 the estimation curve for a unity magnitude vector for the calculation of the magnitude of complex numbers as implemented in the DSP used for the determination of the harmonic content of the PV current signal.

Accordingly, the combination shown in the last row of the above table has been implemented and the resulting estimation curve 26 for a unity magnitude vector is shown in FIG. 5.

The DSP 15 includes a detection unit 18 for deciding whether a bad contact exists and—if so—for producing the "bad contact" signal 6. Finally, the DSP 15 includes a logic unit 7 for deciding whether a permanent arc exists and—if so—for producing the "long arc present" signal 8.

In order to determine whether an arc exists, the threshold has to be determined. However, before determination of the threshold, the algorithm should arrive in its steady state. At the beginning, all buffers are initially set to zero. Accordingly, during the first 20 frames, each having 1024 samples of the digital current signal 4''' and each taken during the corresponding time segment of a filtered current signal, no calculations are carried out. This time is required to initialise the internal buffers and to reach the steady state.

After this initializing phase, the algorithm adopts itself to the environment produced by the converter arrangement, which typically is a noisy environment. This noise floor detection delivers the reference value for the harmonic content of the current signal which can be compared with the harmonic content at a later point in time. The noise floor is calculated as the average amplitude of harmonic components in a range that roughly corresponds to the 3 dB bandwidth of the band-pass filter 14, or in a range that corresponds to some parts of the bandwidth of the filter 14. The spectral range which is used for the noise floor calculations depends on the particular circumstances, i.e. on the converter arrangement and the PV system used. It may for example depend on the inverter, the cables, the PV cells and/or the topology of the system and may also depend on other factors. In some cases, the converter arrangement can produce harmonic components in such a way that certain parts of the spectrum have significantly larger amplitudes than the rest of the spectrum (for example, the spectrum may be polluted by the inverter operation). Those parts of the spectrum with significantly larger amplitudes are detected and excluded from the noise floor calculations. For example, if the observed spectrum is from 1 kHz to 5 kHz and if a converter arrangement generates significant harmonic components in the range of frequencies from 1 kHz to 2 kHz and from 4 kHz to 5 kHz, then the noise floor calculations were performed taking into account only the range of frequencies from 2 kHz to 4 kHz. The threshold for later comparison is then determined for example as a multiple of the noise floor.

In this example, the threshold is determined by summing up the harmonic amplitudes in the frequency range from 2 kHz up to 4 kHz over 10 consecutive data frames of the digital current signal 4''' where these data frames overlap by 50%. The value of this sum is ten times higher than the average harmonic content during these 10 data frames and is therefore directly used as the threshold for later comparison. It is therefore crucial that no arc or bad contact is present during these 10 consecutive data frames in order to determine the "no arc" level of the harmonics (this initial test can be performed for example during FAT (factory tests)).

If however, one (or more) dedicated harmonic components has significantly larger amplitude than the rest of the harmonic components in the spectrum, then the probability is very high that this (these) harmonic components are not caused by an arc, but by some other factor such as for example by an instable regulation loop of the converter arrangement. Such single harmonic components should not be considered when determining the harmonic content of the current signal. Accordingly, a function is implemented to monitor the current signal spectrum and to identify such single harmonics.

This function firstly calculates an average amplitude over the same spectral parts over which the threshold is calculated. The obtained average value is then used as a noise floor for the single harmonic detection. If an amplitude of a single harmonic is more than a factor m times greater than this average value, then that harmonic is considered a single harmonic. The factor m is for example chosen as 10, but can also be different, usually in the range from 2 to 15.

In this way, an initial number of single harmonics is determined and stored during this "no arc" period at the beginning. The number of single harmonics is later determined during bad contact and arc detection and compared with this initial value.

After the initialisation and the threshold determination, the bad contact and arc detection starts. To determine the harmonic content 19 of the digital current signal 4''', the amplitudes of the selected harmonics are summed up over each data frame. And additionally, the number of single harmonics with an amplitude greater than m times the initially determined mean value is determined for each data frame. Then the obtained harmonic content 19 (i.e. the sum of the amplitudes of the selected harmonics) is compared to the previously determined threshold and the number of single harmonics is compared to the initial number of single harmonics. If the harmonic content 19 becomes greater than the threshold and/or the difference between the number of single harmonics and the initial number of single harmonics is larger than p, the detection unit 18 decides that a bad contact is present in the time segment that corresponds to the actual data frame and produces the "bad contact" signal 6. The number p is for example set to be between 30 and 70, for example to be 50, but may also be chosen to be higher or lower. The signal 6 is then transferred to a logic unit 7, which determines whether the arc condition is permanent and produces a "long arc present" signal 8 when the arc is permanent. The permanent arc condition is detected if the temporary arc condition is detected in q or more frames, during a time period which corresponds to r consecutive frames. The number q is reset to zero at the end of each time period of r frames. The number q is for example set to be between 5 and 20, for example to be 10 but may also be chosen to be higher or lower. The number r is for example set to 30 but may also be chosen to be higher or lower.

In summary, it is to be noted that the invention enables a very fast and reliable detection of serial arcs in converter arrangements for converting a DC input power to an output power. The described FFT algorithm can be implemented with standard components like DSPs and the like and allows very fast and accurate calculations. With a 1024-FFT, a sampling frequency of 10 kHz and for example 10 of 30 overlapping frames for threshold comparison, it takes from about 0.5 to about 1.5 seconds to detect an arc.

The invention claimed is:

1. A method for detection of an arc in a current path of a converter arrangement for converting a DC input power to an output power, the method comprising:
producing a current signal by sensing a current in the current path; and
determining a harmonic content of a current signal for at least two time segments, where the harmonic content of a time segment is determined by summing up amplitudes of selected harmonics of the respective time segments, and
determining that an arc exists if the harmonic content during two or more of the time segments exceeds a threshold.

2. A method according to claim 1, wherein the current path is a DC current path of the converter arrangement as the arc is a serial arc.

3. A method according to claim 2, wherein the converter is a photovoltaic panel.

4. A method according to claim 1, further including the step of removing at least partially a harmonic component of the current signal not being caused by the arc before the harmonic content of the current signal is determined.

5. A method according to claim 4, wherein the harmonic component of the current signal below a first frequency is at least partially removed.

6. A method according to claim 5, further including the step of removing at least partially the harmonic component of the current signal above a second frequency where the second frequency is higher than the first frequency.

7. A method according to claim 1, further including the step of processing the current signal by performing an analog-to-digital conversion before the harmonic content of the current signal is determined.

8. A method according to claim 1, further including the step of transforming the current signal from a time domain to a frequency domain.

9. A method according to claim 1, further including the step determining the threshold.

10. A method according to claim 9, wherein the threshold is determined during a startup phase of the method.

11. A method according to claim 1, wherein the DC input power is converted by the converter arrangement to an AC output power.

12. A method for detection of an arc in a current path of a converter arrangement for converting a DC input power to an output power, the method comprising:
producing a current signal by sensing a current in the current path;
determining a harmonic content of a current;
deciding that the arc exists if the harmonic content exceeds a threshold and/or if the number of selected harmonics exceeds a predetermined value; and
conducting a self test, wherein the step of conducting the self test includes the following steps
generating a test signal;

feeding the test signal over a low pass filter to the current sensing device;

determining an amplitude and/or a phase of the test signal; and comparing the amplitude and/or the phase of the test signal with predefined values.

13. A device for detection of an arc in a current path of a converter arrangement for converting DC input power to an output power, the device comprising a current sensing device adapted to produce a current signal by sensing a current in the current path, a processing unit adapted to determine a harmonic content of the current signal for at least two time segments of the current signal, where the harmonic content of a time segment is determined by summing up amplitudes of selected harmonics of the respective time segments; and decide that an arc is present if the harmonic content exceeds a threshold during two or more of the time segments.

14. A device according to claim 13, wherein the processing unit is a digital signal processor.

15. A device according to claim 13, adapted for detection of a serial arc in a DC current path of the converter arrangement.

16. A device according to claim 15, wherein the current sensing device includes a current sensor, comprising an iron powder core toroidal transformer with a primary winding (P) and a secondary winding (S), where the primary winding (P) includes one turn of the DC current path and where the secondary winding (S) includes a plurality of turns.

17. A device according to claim 13, further including a band pass filter for band pass filtering the current signal.

18. A device for detection of an arc in a current path of a converter arrangement for converting DC input power to an output power, adapted to execute the method according to claim 1, the device comprising a current sensing device adapted to produce a current signal by sensing a current in the current path, a processing unit adapted to determine a harmonic content of the current signal for at least two time segments of the current signal, where the harmonic content of a time segment is determined by summing up amplitudes of selected harmonics of the respective time segments; and decide that an arc is present if the harmonic content exceeds a threshold during two or more of the time segments;

a test signal generator adapted to generate a test signal, and a low pass filter for low pass filtering the test signal and feeding it to the current sensing device, wherein the device is adapted to determine an amplitude and/or a phase of the test signal and to compare the amplitude and/or the phase of the test signal with predefined values.

19. A converter arrangement including a device according to any of claims 13 to 18.

20. A method according to claim 8, further comprising:

performing a discrete Fourier transform, preferably by performing a fast Fourier transform.

21. A method according to claim 10, wherein the threshold is determined during the startup phase of the method by determining a harmonic content of at least one portion of the current signal and multiplying the harmonic content of the at least one portion of the current signal by a factor n, where n is a number greater than 2.

22. A device according to claim 17, wherein the band pass filter is an analog band pass filter.

23. A method according to claim 1, wherein deciding that the arc exists further includes the step of determining if a number of single harmonics exceed a predetermined value.

* * * * *